United States Patent
Kuno et al.

(10) Patent No.: US 8,735,771 B2
(45) Date of Patent: May 27, 2014

(54) LASER MACHINING METHOD

(75) Inventors: Koji Kuno, Hamamatsu (JP); Tatsuya Suzuki, Hamamatsu (JP)

(73) Assignee: Hamamatsu Photonicks K.K., Hamamatsu-shi, Shizuoka (JP)

(*) Notice: Subject to any disclaimer, the term of this patent is extended or adjusted under 35 U.S.C. 154(b) by 556 days.

(21) Appl. No.: 11/886,655

(22) PCT Filed: Mar. 20, 2006

(86) PCT No.: PCT/JP2006/305594
§ 371 (c)(1),
(2), (4) Date: May 13, 2008

(87) PCT Pub. No.: WO2006/101091
PCT Pub. Date: Sep. 28, 2006

(65) Prior Publication Data
US 2009/0032509 A1    Feb. 5, 2009

(30) Foreign Application Priority Data
Mar. 22, 2005    (JP) .................. P2005-082737

(51) Int. Cl.
*B23K 26/42*    (2006.01)
(52) U.S. Cl.
USPC .................... 219/121.69; 219/121.6
(58) Field of Classification Search
USPC ............. 219/121.6, 121.68, 121.67, 121.69
See application file for complete search history.

(56) References Cited

U.S. PATENT DOCUMENTS

| | | | |
|---|---|---|---|
| 5,548,890 A * | 8/1996 | Tada et al. ................. | 29/827 |
| 6,992,026 B2 | 1/2006 | Fukuyo et al. | |
| 2008/0035611 A1 | 2/2008 | Kuno et al. | |

FOREIGN PATENT DOCUMENTS

| | | | | |
|---|---|---|---|---|
| CN | 1575908 A | | 2/2005 | |
| EP | 1 338 371 | | 8/2003 | |
| EP | 1 580 800 | | 9/2005 | |
| JP | 59-212185 | | 12/1984 | |
| JP | 59212185 A | * | 12/1984 | ............ B23K 26/00 |
| JP | 08-019888 A | | 1/1996 | |
| JP | 2002-43254 | | 2/2002 | |

(Continued)

OTHER PUBLICATIONS

K. Hayashi; "Inner Glass Marking by Harmonics of Solid-State Laser", Proceedings of 45$^{th}$ Laser Materials Processing Conference, Dec. 1998, pp. 23-28.

(Continued)

*Primary Examiner* — Henry Yuen
*Assistant Examiner* — Ayub Maye
(74) *Attorney, Agent, or Firm* — Drinker Biddle & Reath LLP

(57) ABSTRACT

A laser processing method which can reduce the chipping generated when a plate-like object to be processed formed with a modified region is turned into small pieces in steps other than its dividing step. In a part extending along a line to cut in an object to be processed, laser light is oscillated in a pulsing fashion in an intermediate portion including an effective part, and is continuously oscillated in one end portion and the other end portion on both sides of the intermediate portion. Since the laser light intensity becomes lower in continuous oscillation than in pulse oscillation, modified regions can be formed in the intermediate portion but not in one end portion and the other end portion. This keeps the modified regions from reaching the outer face of the substrate, thus making it possible to prevent particles from occurring when forming the modified regions.

7 Claims, 27 Drawing Sheets

(56) References Cited

FOREIGN PATENT DOCUMENTS

| | | | |
|---|---|---|---|
| JP | 2002-75919 | | 3/2002 |
| JP | 2002-192370 A | | 7/2002 |
| JP | 2003-1473 | | 1/2003 |
| JP | 2003001473 A | * 1/2003 | ............ B23K 26/06 |
| JP | 2004001076 A | * 1/2004 | ............ B23K 26/00 |
| JP | 2004-231555 | | 8/2004 |
| JP | 2005-28423 | | 2/2005 |
| TW | 200539980 | | 12/2005 |
| WO | WO 02/22301 | | 3/2002 |
| WO | WO 03/076118 | | 9/2003 |
| WO | WO 2006/013763 | | 2/2006 |

OTHER PUBLICATIONS

K. Miura et al., "Formation of Photo-Induced Structures in Glasses with Femtosecond Laser", Proceedings of $42^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

Office Action issued Sep. 24, 2012 in counterpart Korean Application No. 10-2007-7024138.

* cited by examiner

*Fig.16*
(a)
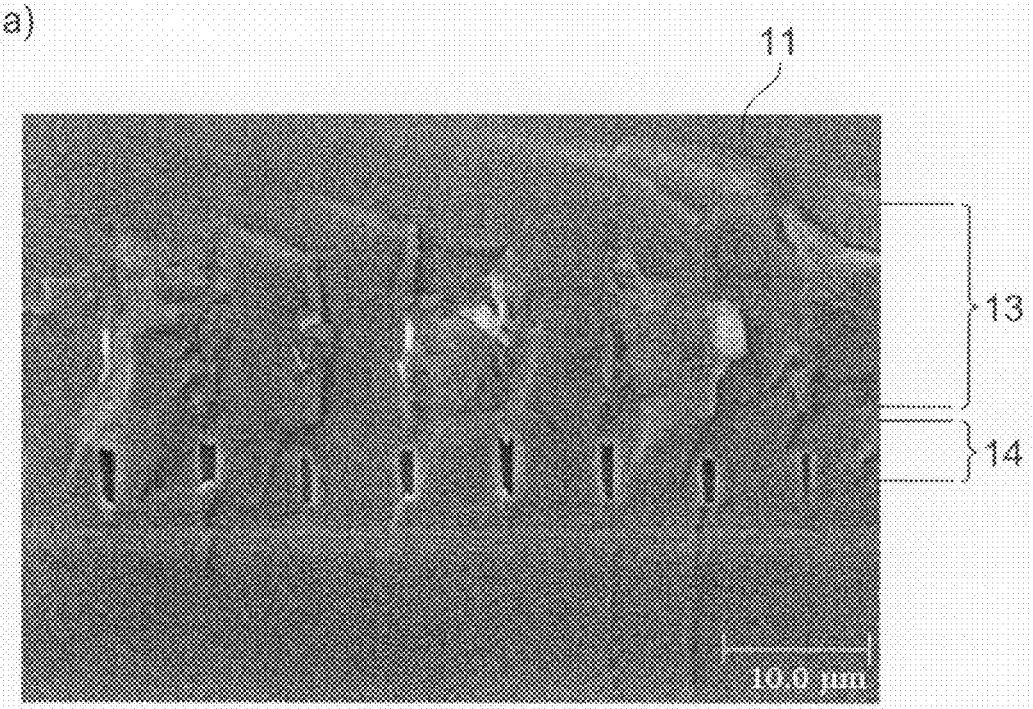
(b)
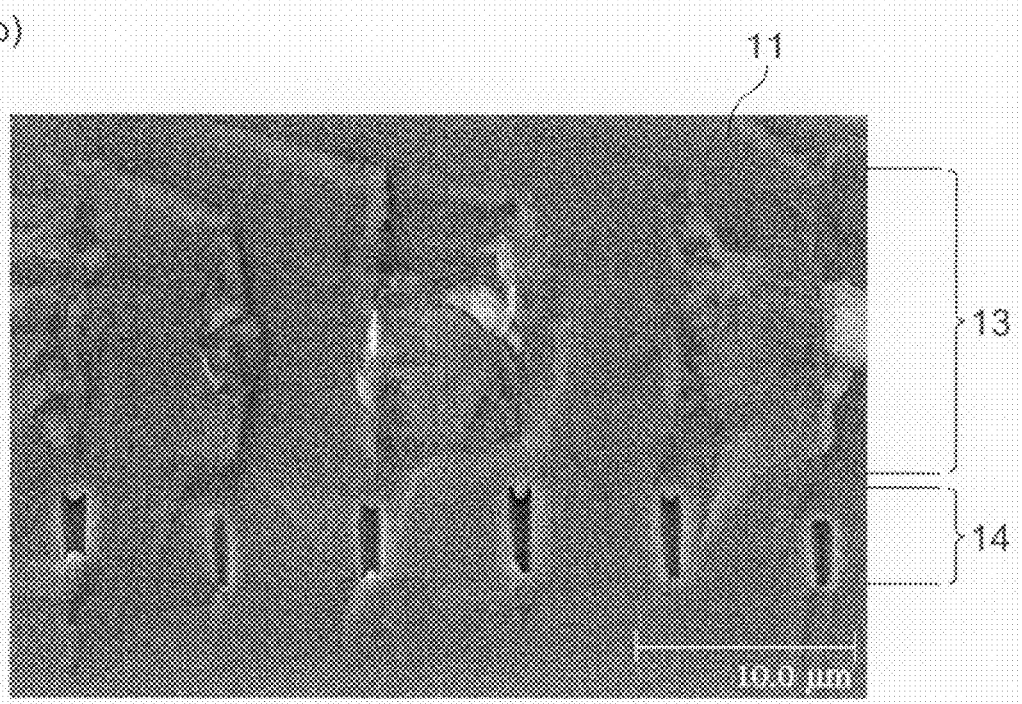

Fig.19
(a)
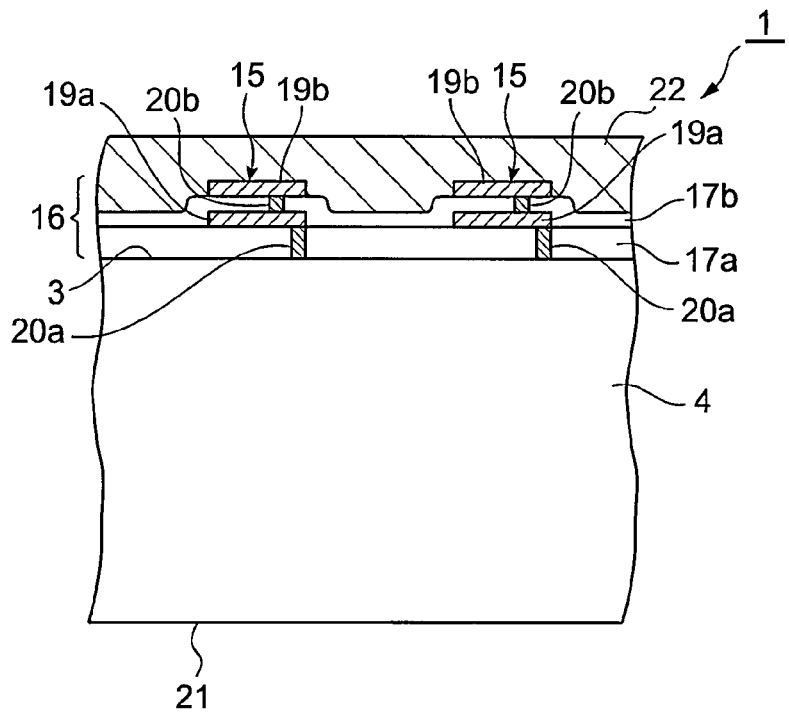
(b)
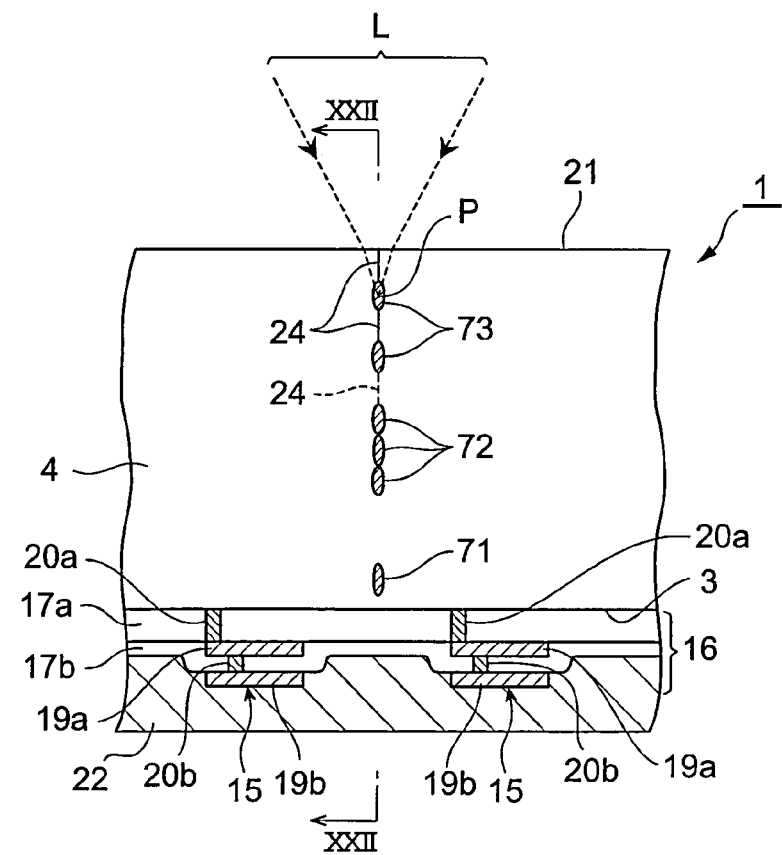

*Fig. 20*
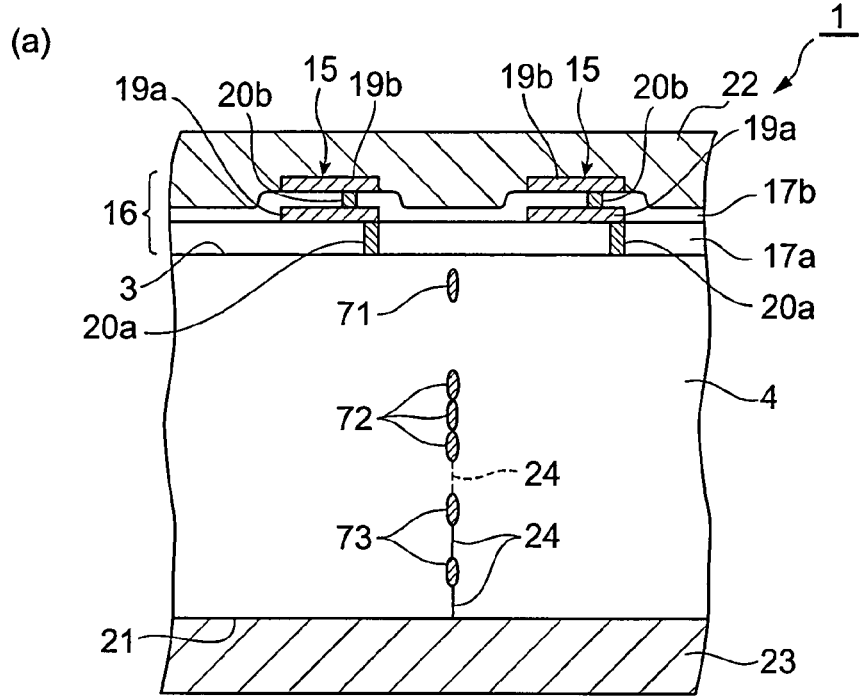
(a)
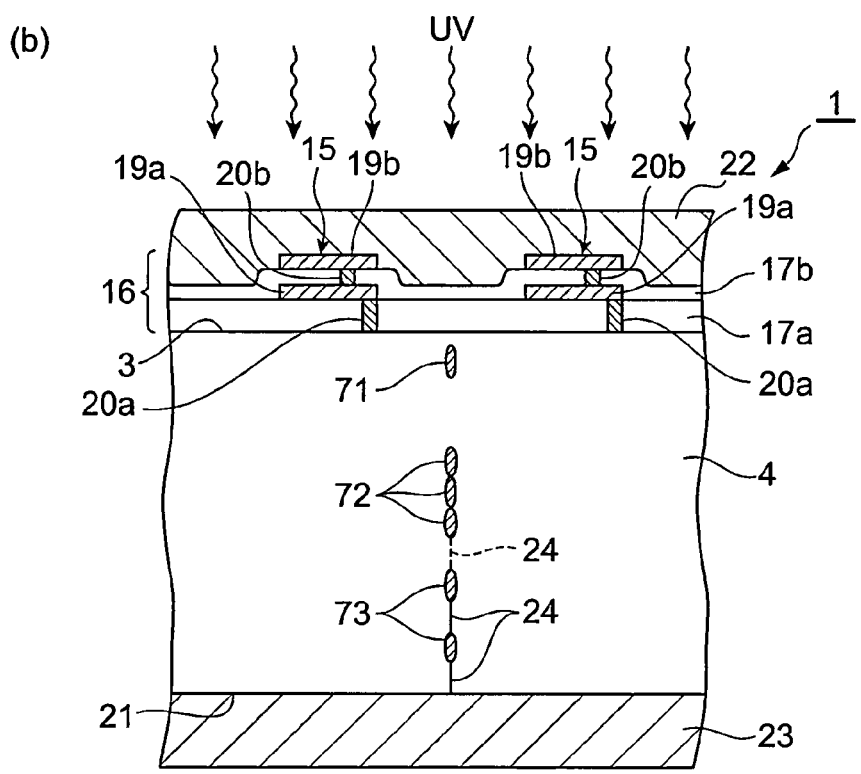
(b)

LASER MACHINING METHOD

TECHNICAL FIELD

The present invention relates to a laser processing method used for cutting a plate-like object to be processed.

BACKGROUND ART

Known as an example of conventional techniques of this kind is a laser processing method disclosed in Patent Document 1. The laser processing method disclosed in Patent Document 1 irradiates a plate-like object with laser light along a line to cut, so as to form a modified layer within the plate-like object.
Patent Document 1: Japanese Patent Application Laid-Open No. 2005-28423

DISCLOSURE OF THE INVENTION

Problem to be Solved by the Invention

In the laser processing method disclosed in Patent Document 1, however, the modified layer does not stop within the plate-like object but reaches the outer face thereof (see FIG. 6 in Patent Document 1). Therefore, in the process of being transferred to a tape expander in which the plate-like object is divided into chips, the step of reversing the plate-like object, and the like, the plate-like object may be turned into small pieces even if not divided into all the chips. When the plate-like object is thus turned into small pieces, cut sections of the small pieces may rub against each other, so as to cause chipping, thereby lowering the nondefective product ratio of chips, or circuits and the like formed on the surface of the plate-like object may be contaminated with dust caused by chipping.

In view of such circumstances, it is an object of the present invention to provide a laser processing method which can reduce the chipping generated when a plate-like object to be processed formed with a modified region is turned into small pieces in steps other than its dividing step.

Means for Solving Problem

For achieving the above-mentioned object, the present invention provides a laser processing method for forming a modified region to become a starting point for cutting within a plate-like object to be processed along a line to cut the object by irradiating the object with laser light while locating a light-converging point within the object; wherein the object comprises an effective part and an outer peripheral part surrounding the effective part; the method comprising the step of oscillating the laser light in a pulsing fashion in an intermediate portion including the effective part in a part extending along the line to cut in the object, and continuously oscillating the laser light in one end portion and the other end portion on both sides of the intermediate portion.

In a part extending along a line to cut in the object to be processed, the laser processing method oscillates the laser light in a pulsing fashion in an intermediate portion including an effective part and continuously oscillates the laser light in one end portion and the other end portion on both sides of the intermediate portion. Since the laser light intensity becomes lower in continuous oscillation than in pulse oscillation, a modified region can be formed in the intermediate portion but not in one end portion and the other end portion. This keeps the modified region from reaching the outer face of the object to be processed, so that the object is not turned into small pieces in steps other than its dividing step, which makes it possible to restrain chipping from being caused by cut sections of small pieces rubbing against each other. On the other hand, a modified region is reliably formed in the effective part surrounded by the outer peripheral part, whereby the effective part can be cut with a high precision along the line to cut while using the modified region as a starting point for cutting. The modified region is formed by irradiating the object with laser light while locating a light-converging point within the object, so as to generate multiphoton absorption or other kinds of light absorption within the object.

There is a case where a plurality of functional devices are formed into a matrix on a surface of the effective part. The functional devices refer to semiconductor operating layers formed by crystal growth, light-receiving devices such as photodiodes, light-emitting devices such as laser diodes, and circuit devices formed as circuits, for example.

Preferably, the line to cut is set in a lattice with respect to the object so as to pass between adjacent functional devices. As mentioned above, the effective part can be cut with a high precision along the line to cut, whereby a plurality of chips each having a functional device can be obtained in a state cut with a favorable precision.

The effective part and outer peripheral part may be formed integrally by a semiconductor material, whereas the modified region may include a molten processed region.

The object may be cut along the line to cut after forming the modified region. In this case, as mentioned above, the effective part can be cut with a high precision along the line to cut while using the modified region as a starting point for cutting as mentioned above.

Effect of the Invention

In the present invention, a plate-like object to be processed formed with a modified region is hard to turn into small pieces in steps other than its dividing step, thus making it possible to restrain chipping from being caused by cut sections of small pieces rubbing against each other.

BRIEF DESCRIPTION OF THE DRAWINGS

FIG. 16 is a view showing a photograph of a cross section of a silicon wafer formed with molten processed regions and microcavities;

FIG. 19 is a partly sectional view of the object for explaining the laser processing method in accordance with the embodiment, in which (a) shows a state where a protective tape is attached to the object, and (b) shows a state where the object is irradiated with laser light;

FIG. 20 is a partly sectional view of the object for explaining the laser processing method in accordance with the embodiment, in which (a) shows a state where an expandable tape is attached to the object, and (b) shows a state where the protective tape is irradiated with UV rays;

EXPLANATIONS OF NUMERALS AND LETTERS

1 . . . object to be processed; 5 . . . line to cut; 7 . . . modified region; 13 . . . molten processed region; 15 . . . functional device; 41 . . . effective part; 42 . . . outer peripheral part; 51 . . . intermediate portion; 52 . . . one end portion; 53 . . . other end portion; 71 . . . quality modified region; 72 . . . segmented modified region; 73 . . . HC modified region; L . . . laser light; P . . . light-converging point.

BEST MODES FOR CARRYING OUT THE INVENTION

In the following, preferred embodiments of the method of cutting an object to be processed in accordance with the present invention will be explained in detail with reference to the drawings. In these embodiments, a phenomenon known as multiphoton absorption is used for forming a modified region within the object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at a light-converging point. The multiphoton absorption occurs under a condition where the peak power density is 1×10$^8$ (W/cm$^2$) or greater, for example. The peak power density is determined by (energy of laser light at the light-converging point per pulse)/(beam spot cross-sectional area of laser light × pulse width). In the case of continuous waves, the intensity of laser light is determined by the field intensity (W/cm$^2$) of laser light at the light-converging point.

Figure 1:
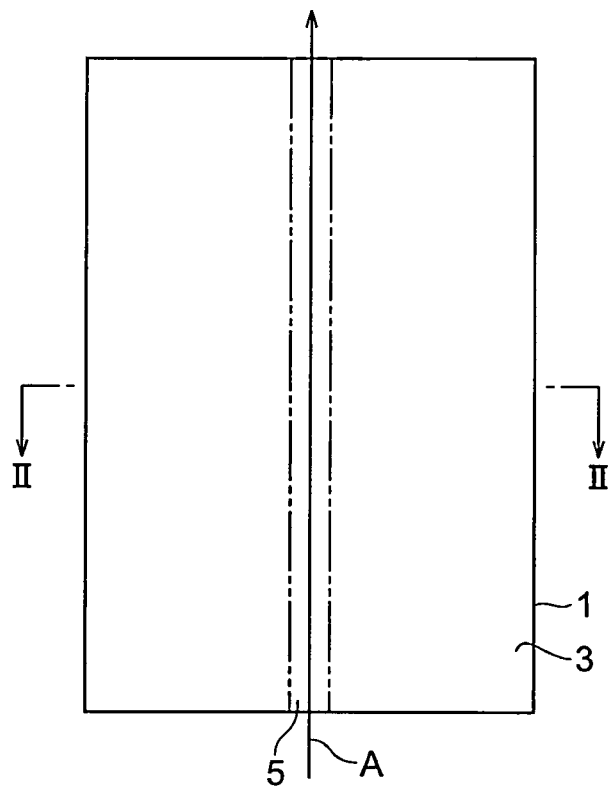
FIG. 1 is a plan view of an object to be processed during laser processing by a laser processing method in accordance with an embodiment of the present invention.
Figure 2:
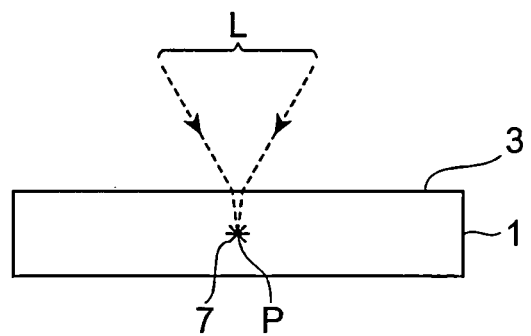
FIG. 2 is a sectional view of the object taken along the line II-II of FIG. 1.

The principle of the laser processing method in accordance with an embodiment using such multiphoton absorption will be explained with reference to FIGS. 1 to 6. As shown in FIG. 1, on a front face 3 of a plate-like object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a light-converging point P therewithin under a condition generating multiphoton absorption, so as to form a modified region 7. The light-converging point P is a position at which the laser light L is converged. The line to cut 5 may be curved instead of being straight, and may be a line actually drawn on the object 1 without being restricted to the virtual line.

Figure 3:
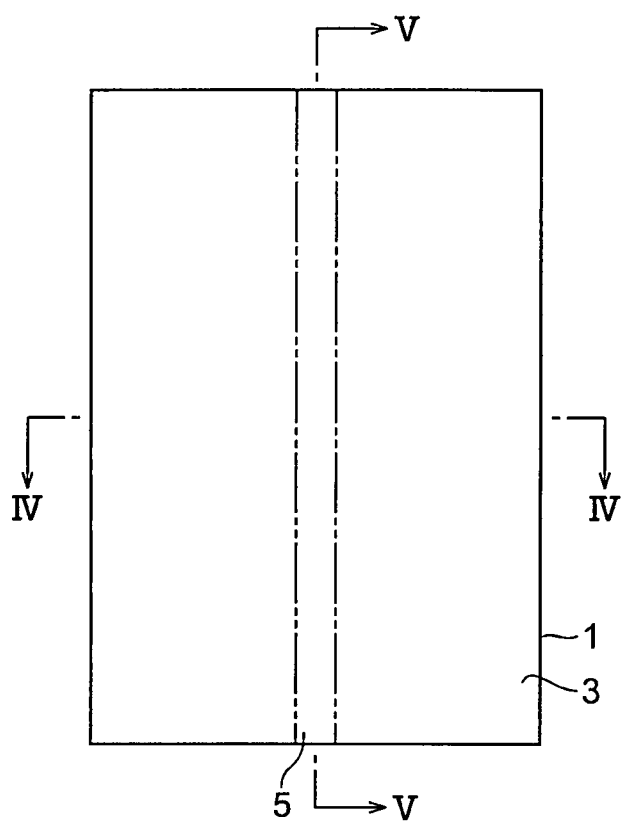
FIG. 3 is a plan view of the object after the laser processing in accordance with the embodiment.
Figure 4:
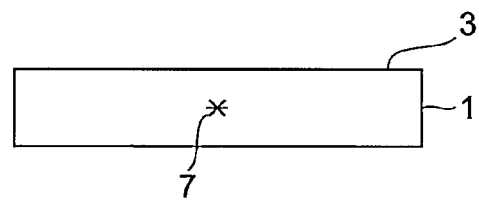
FIG. 4 is a sectional view of the object taken along the line IV-IV of FIG. 3.
Figure 5:
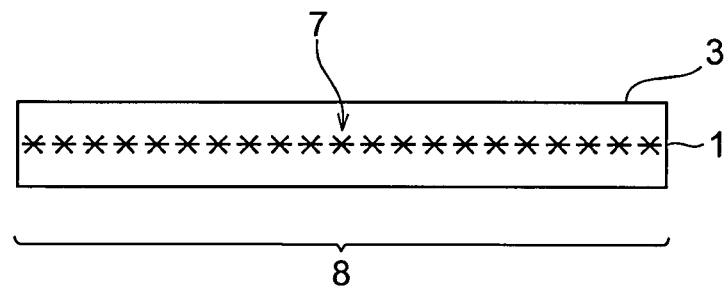
FIG. 5 is a sectional view of the object taken along the line V-V of FIG. 3.

Then, the laser light L is relatively moved along the line to cut 5 (i.e., in the direction of arrow A in FIG. 1), so as to shift the light-converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
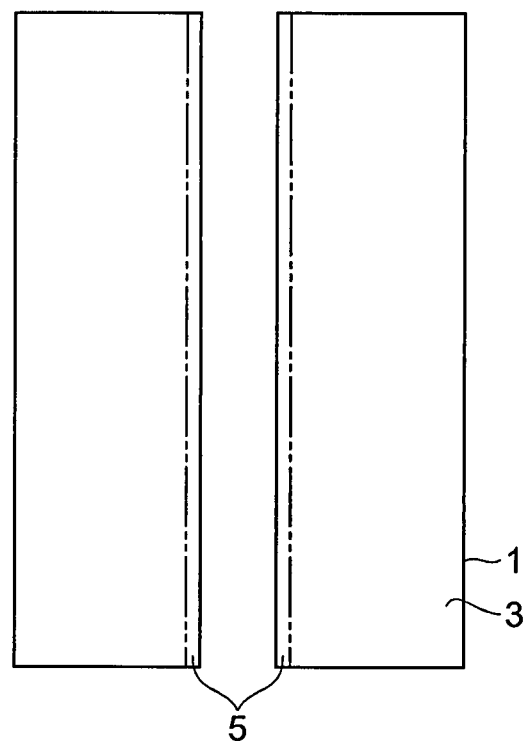
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. The first case is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other case is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is quite effective, since the object 1 to be processed such as silicon wafer has recently been apt to decrease its thickness.

The modified region formed by multiphoton absorption in the laser processing method in accordance with this embodiment encompasses the following cases (1) to (4):

(1) Case Where the Modified Region is a Crack Region Including One Crack or a Plurality of Cracks An object to be processed (e.g., glass or a piezoelectric material made of $LiTaO_3$) is irradiated with laser light while locating a light-converging point therewithin under a condition with a field intensity of at least $1 \times 10^8$ (W/cm$^2$) at the light-converging point and a pulse width of 1 μs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (Dec. 1998), pp. 23-28.

The inventors determined the relationship between field intensity and crack size by an experiment. The following are conditions of the experiment.

(A) Object to be Processed: Pyrex (Registered Trademark) Glass (with a Thickness of 700 μm)

(B) Laser
light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: output<1 mJ/pulse
laser light quality: $TEM_{00}$
polarizing property: linear polarization
(C) Condenser Lens
transmittance at a laser light wavelength: 60%

(D) Moving Rate of the Mount Table Mounting the Object: 100 mm/sec

The laser light quality of $TEM_{00}$ means that the light-converging characteristic is so high that convergence to about the wavelength of laser light is possible.

Figure 7:
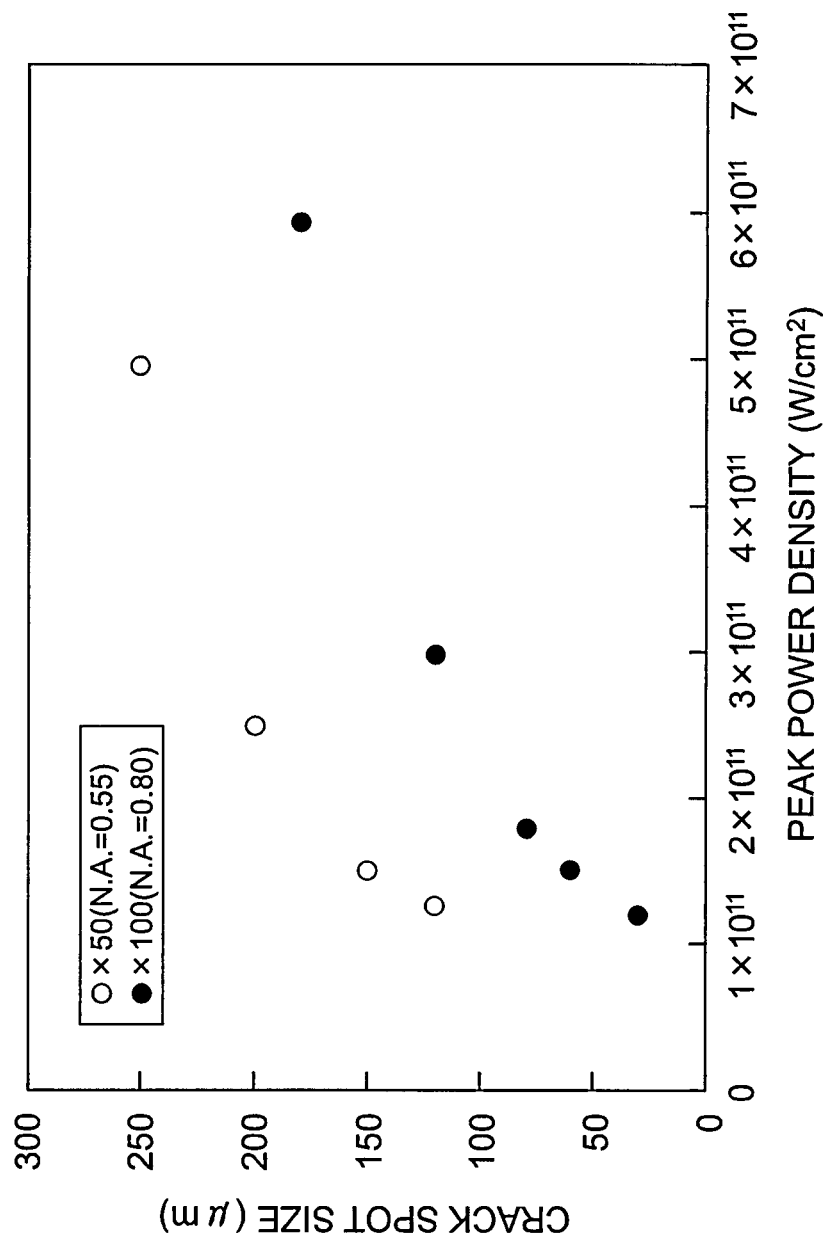
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
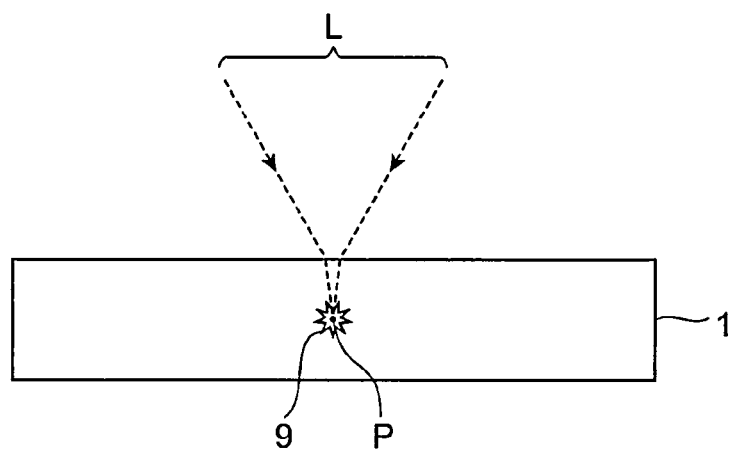
FIG. 8 is a sectional view of the object in a first step of the laser processing method in accordance with the embodiment.
Figure 9:
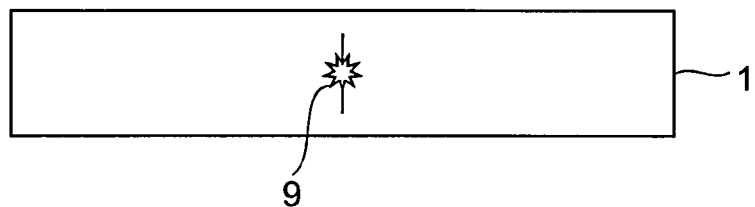
FIG. 9 is a sectional view of the object in a second step of the laser processing method in accordance with the embodiment.
Figure 10:
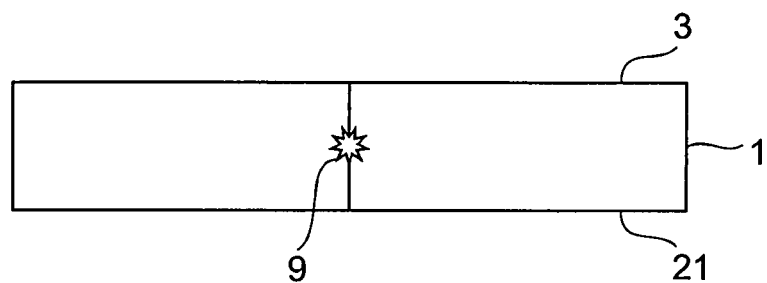
FIG. 10 is a sectional view of the object in a third step of the laser processing method in accordance with the embodiment.
Figure 11:
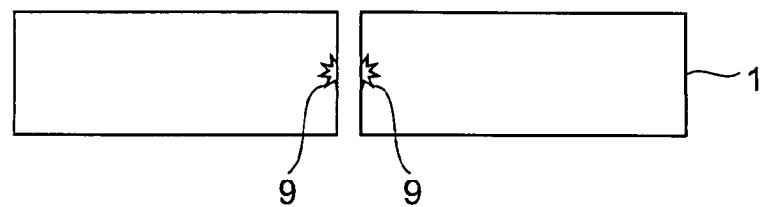
FIG. 11 is a sectional view of the object in a fourth step of the laser processing method in accordance with the embodiment.

A mechanism by which the objet to be processed is cut by forming a crack region will now be explained with reference to FIGS. 8 to 11. As shown in FIG. 8, the object 1 is irradiated with laser light L while the light-converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. As shown in FIG. 9, a crack further grows from the crack region 9 acting as a start point (i.e., from the starting point region for cutting acting as a start point), and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case Where the Modified Region is a Molten Processed Region

An object to be processed (e.g., semiconductor material such as silicon) is irradiated with laser light while locating a light-converging point within the object under a condition with a field intensity of at least $1 \times 10^8$ (W/cm$^2$) at the light-converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be Processed: Silicon Wafer (with a Thickness of 350 μm and an Outer Diameter of 4 Inches)

(B) Laser light source: semiconductor laser pumping Nd:YAG laser wavelength: 1064 nm laser light spot cross-sectional area: $3.14 \times 10^{-8}$ cm$^2$ oscillation mode: Q-switched pulse repetition frequency: 100 kHz pulse width: 30 ns output: 20 μJ/pulse laser light quality: TEM$_{00}$ polarizing property: linear polarization (C) Condenser Lens magnification: ×50

N.A.: 0.55 transmittance at a laser light wavelength: 60%

(D) Moving Rate of the Mount Table Mounting the Object: 100 mm/sec

Figure 12:
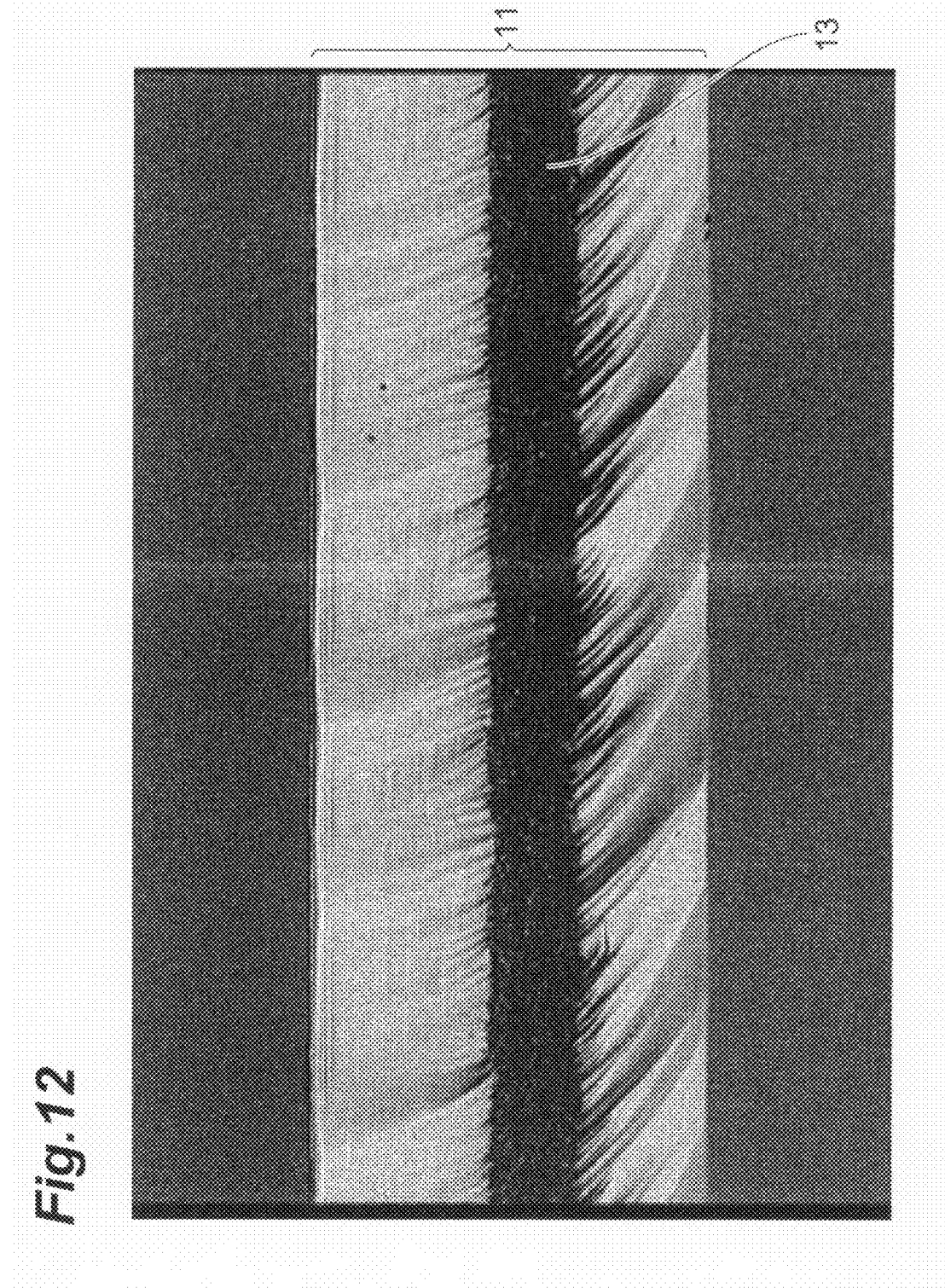
FIG. 12 is a view showing a photograph of a cut section of a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
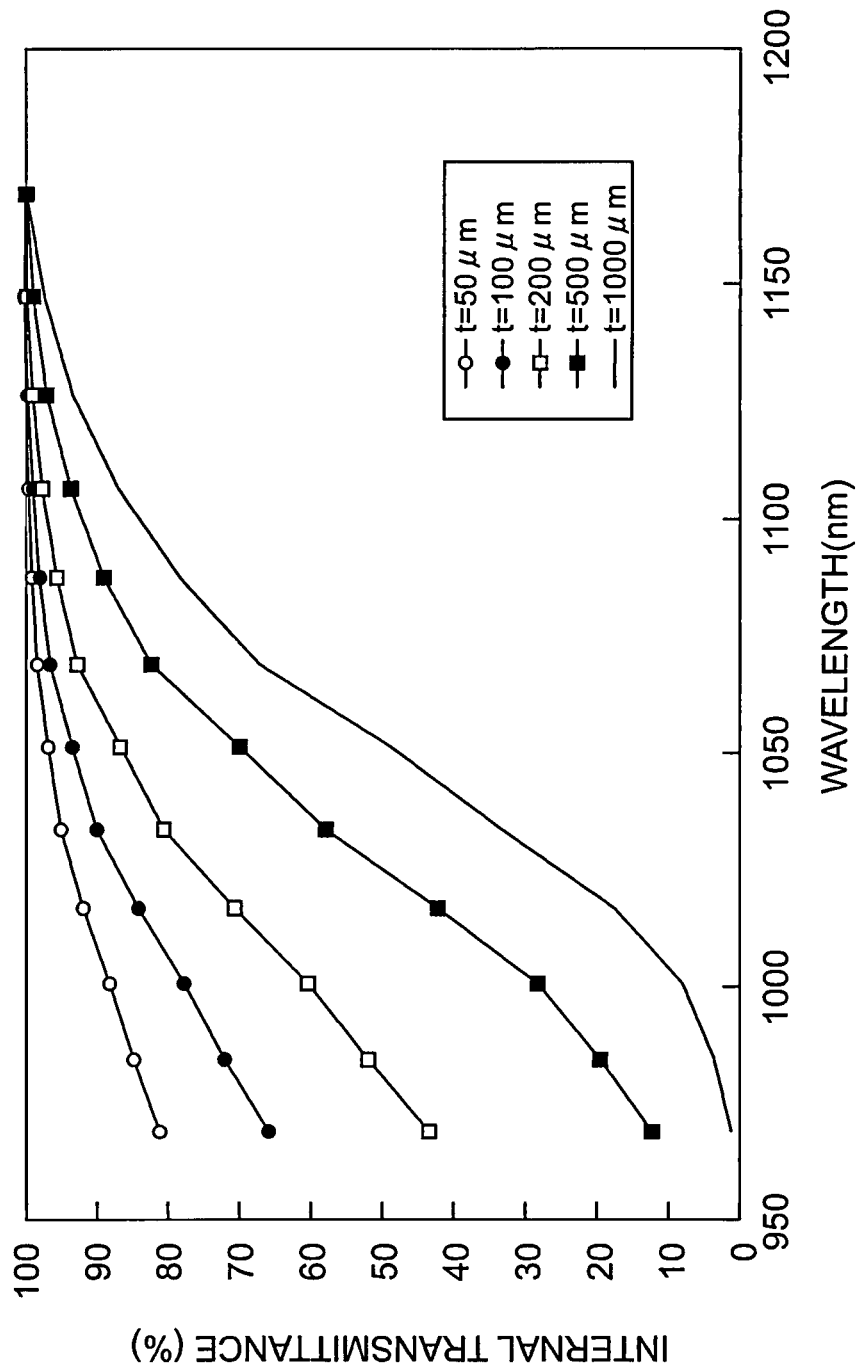
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon-substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (Apr. 2000), pp. 72-73.

A fracture is generated in a silicon wafer from a starting point region for cutting formed by a molten processed region, acting as a start point, toward a cross section, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten-processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier.

(3) Case Where the Modified Region is Formed by a Molten Processed Region and a Microcavity An object to be processed (e.g., semiconductor material such as silicon) is irradiated with laser light while locating a light-converging point within the object under a condition with a field intensity of at least $1 \times 10^8$ (W/cm$^2$) at the light-converging point and a pulse width of 1 μs or less. This may form a molten processed region and a microcavity within the object. The upper limit of field intensity is $1 \times 10^{12}$ (W/cm$^2$), for example. The pulse width is preferably 1 ns to 200 ns, for example.

Figure 14:
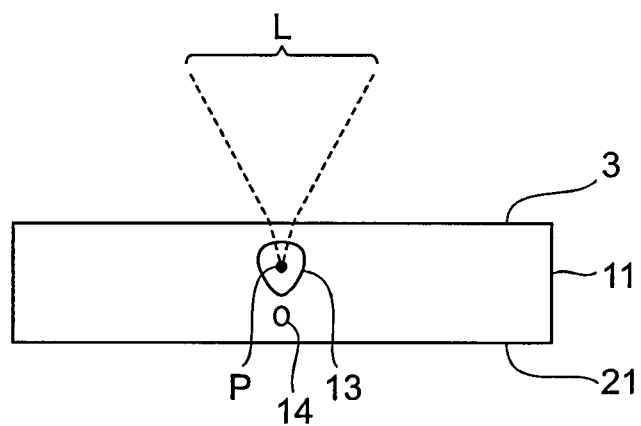
FIG. 14 is a sectional view of a silicon wafer formed with a molten processed region and microcavity by the laser processing method in accordance with the embodiment.

When laser light L is incident on a silicon wafer 11 from its front face 3 side as shown in FIG. 14, a microcavity 14 is formed on the rear face 21 side of the molten processed region 13. The molten processed region 13 and the microcavity 14 are separated from each other in FIG. 14, but may be formed continuously as well. Namely, when the molten processed region 13 and the microcavity 14 are formed as a pair by multiphoton absorption, the microcavity 14 is formed on the opposite side of the laser light entrance face from the molten processed region 13 in the silicon wafer 11.

It is not completely clear by what principle the microcavity 14 is thus formed so as to correspond to each molten processed region formed by generating multiphoton absorption within the silicon wafer 11 by transmitting the laser light L therethrough. Two hypotheses assumed by the inventors concerning the principle by which the molten processed region 13 and the microcavity 14 are formed as a pair will now be explained.

Figure 15:
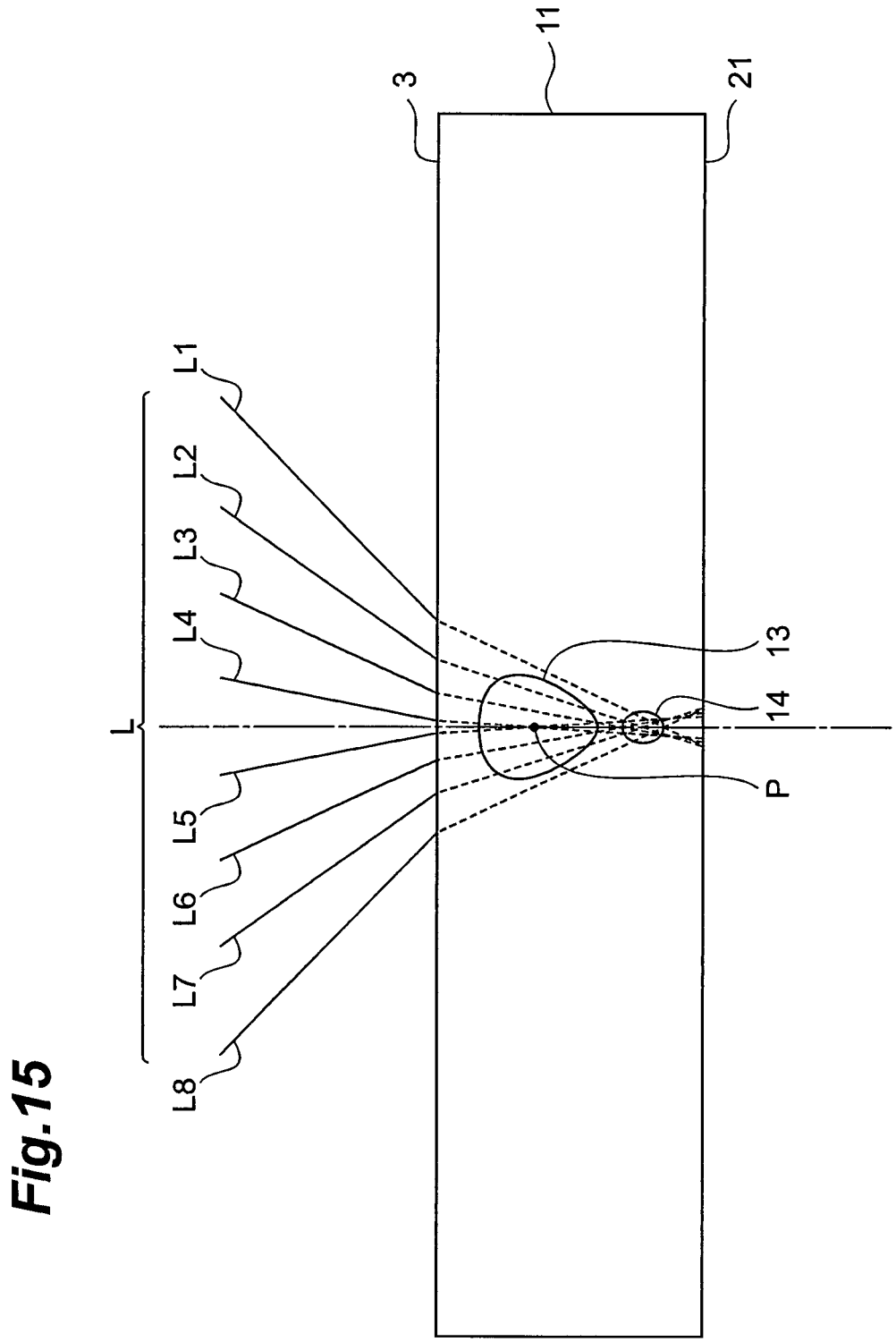
FIG. 15 is a sectional view for explaining a principle by which the molten processed region and microcavity are formed by the laser processing method in accordance with the embodiment.

The first hypothesis assumed by the inventors is as follows. Namely, when the silicon wafer 11 is irradiated with the laser light L focused at a light-converging point P within the silicon wafer 11 as shown in FIG. 15, the molten processed region 13 is formed near the light-converging point P. Conventionally, light components in the center part of the laser light L emitted from a laser light source (light components corresponding to L4 and L5 in FIG. 15) have been used as the laser light L. This aims at using the center part of a Gaussian distribution of the laser light L.

The inventors have tried to expand the laser light L in order to restrain the laser light L from affecting the front face 3 of the silicon wafer 11. In one technique therefor, the laser light L emitted from the laser light source is expanded by a predetermined optical system, so as to widen the skirt of the Gaussian distribution, thereby relatively raising the laser intensity of light components in a peripheral part of the laser light L (those corresponding to L1 to L3 and L6 to L8 in FIG. 15). When thus expanded laser light L is transmitted through the silicon wafer 11, the molten processed region 13 is formed near the light-converging point P, and the microcavity 14 is formed at a part corresponding to the molten processed region 13 as explained above. Namely, the molten processed region 13 and the microcavity 14 are formed at respective positions on the optical axis (dash-dot line in FIG. 15) of the laser light L. The position at which the microcavity 14 is formed corresponds to a part where light components in the peripheral part of the laser light L (those corresponding to L1 to L3 and L6 to L8 in FIG. 15) are theoretically converged.

The spherical aberration of a lens converging the laser light L seems to cause light components in the center part of the laser light L (those corresponding to L4 and L5 in FIG. 15) and light components in the peripheral part of the laser light L (those corresponding to L4 and L5 in FIG. 15) to converge at respective parts different from each other in the thickness direction of the silicon wafer 11. The first hypothesis assumed by the inventors lies in that the difference in light-converging positions may have some effects.

The second hypothesis assumed by the inventors lies in that, since the part where light components in the peripheral part of the laser light L (those corresponding to L4 and L5 in FIG. 15) are converged is a theoretical laser light-converging point, the light intensity is so high in this part that minute structural changes occur, thereby forming the microcavity 14 whose surroundings do not substantially change their crystal structure, whereas the part formed with the molten processed region 13 is thermally affected so much that it is simply molten and re-solidified.

Here, the molten processed region 13 is as stated in (2) mentioned above, whereas the microcavity 14 is one whose periphery does not substantially change its crystal structure. When the silicon wafer 11 has a silicon monocrystal structure, the periphery of the microcavity 14 mostly keeps the silicon monocrystal structure.

By an experiment, the inventors verified that the molten processed region 13 and microcavity 14 were formed within the silicon wafer 11. The following are conditions of the experiment.

(A) Object to be Processed: Silicon Wafer (with a Thickness of 100 μm)

(B) Laser
light source: semiconductor laser pumping Nd:YAG laser
wavelength: 1064 nm
repetition frequency: 40 kHz pulse width: 30 ns
pulse pitch: 7 μm
processing depth: 8 μm
pulse energy: 50 μJ/pulse (C) Condenser Lens
N.A.: 0.55

(D) Moving Rate of the Mount Table Mounting the Object: 280 mm/sec

FIG. 16 is a view showing a photograph of a cut section of the silicon wafer 11 cut by laser processing under the above-mentioned conditions. In FIG. 16, (a) and (b) are respective photographs showing the same cut section on different scales. As depicted, within the silicon wafer 11, pairs of molten processed regions 13 and microcavities 14, each pair being formed by irradiation with one pulse of laser light L, are positioned at a predetermined pitch along the cross section (i.e., along a line to cut).

Each molten processed region 13 in the cross section shown in FIG. 16 has a width of about 13 μm in the thickness direction of the silicon wafer 11 (the vertical direction in the drawing) and a width of about 3 μm in the moving direction of laser light L (the horizontal direction in the drawing). Each microcavity 14 has a width of about 7 μm in the thickness direction of the silicon wafer 11 and a width of about 1.3 μm in the moving direction of laser light L. The gap between the molten processed region 13 and microcavity 14 is about 1.2 μm.

(4) Case Where the Modified Region is a Refractive Index Changed Region

An object to be processed (e.g., glass) is irradiated with laser light while locating a light-converging point within the object under a condition with a field intensity of at least $1 \times 10^8$ (W/cm$^2$) at the light-converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (Nov. 1997), pp. 105-111.

The cases (1) to (4) are explained in the foregoing as a modified region formed by multiphoton absorption. A starting point region for cutting may be formed as follows while taking account of the crystal structure of a wafer-like object to be processed and its cleavage characteristic, whereby the object can be cut with a high precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a III-V family compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the direction to be formed therewith, the starting point region for cutting extending in the direction to be formed with the starting point region for cutting can be formed easily and accurately with reference to the orientation flat.

Figure 17:
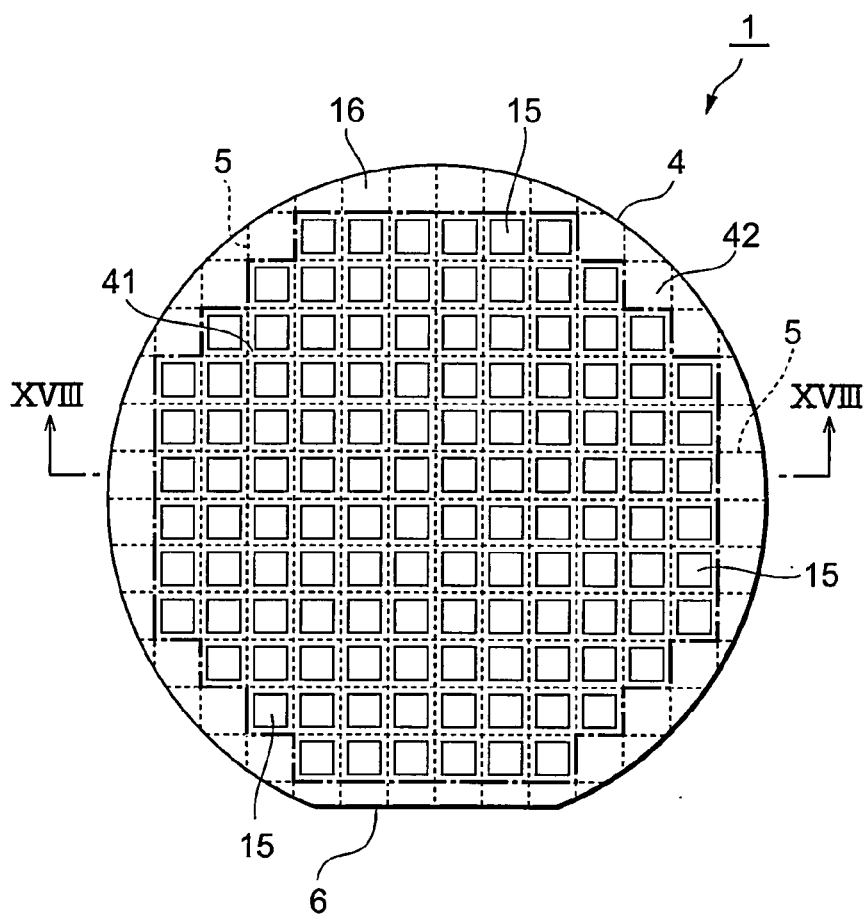
FIG. 17 is a plan view of an object to be processed by the laser processing method in accordance with the embodiment.

A preferred embodiment of the present invention will now be explained. FIG. 17 is a plan view of the object to be processed in the laser processing method in accordance with this embodiment, whereas FIG. 18 is a partly sectional view of the object taken along the line XVIII-XVIII of FIG. 17.

Figure 18:
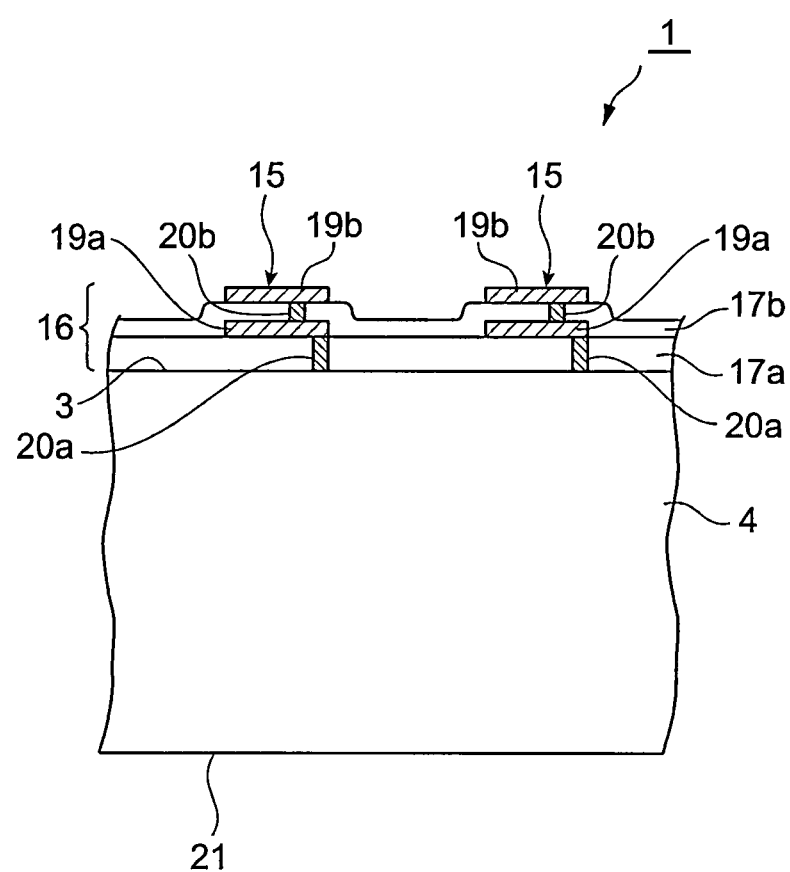
FIG. 18 is a partly sectional view of the object taken along the line XVIII-XVIII of FIG. 17.

As shown in FIGS. 17 and 18, an object to be processed 1 comprises a substrate 4 made of silicon having a thickness of 300 μm; and a laminate part 16, formed on the front face 3 of the substrate 4, including a plurality of functional devices 15. Each functional device 15 comprises an interlayer insulating film 17a laminated on the front face 3 of the substrate 4, a wiring layer 19a disposed on the interlayer insulating film 17a, an interlayer insulating film 17b laminated on the interlayer insulating film 17a so as to cover the wiring layer 19a, and a wiring layer 19b disposed on the interlayer insulating film 17b. The wiring layer 19a and the substrate 4 are electrically connected to each other by a conductive plug 20a penetrating through the interlayer insulating film 17a, whereas the wiring layers 19a and 19b are electrically connected to each other by a conductive plug 20b penetrating through the interlayer insulating film 17b.

The substrate 4 includes an effective part 41 (the part inside of the dash-dot line in FIG. 17) and an outer peripheral part 42 (the part outside of the dash-dot line in FIG. 17) surrounding the effective part 41, whereas the effective part 41 and outer peripheral part 42 are integrally formed by silicon (a semiconductor material). A number of functional devices 15 are formed like a matrix in directions parallel and perpendicular to an orientation flat 6 of the substrate 4, whereas the interlayer insulating films 17a, 17b are formed between neighboring functional devices 15, 15 so as to cover the front face 3 of the substrate 4 as a whole.

Thus configured object 1 is cut into the functional devices 15 as follows. First, as shown in FIG. 19(a), a protective tape 22 is bonded to the object 1 so as to cover the laminate part 16. Subsequently, as shown in FIG. 19(b), the object 1 is fixed onto a mount table (not depicted) of a laser processing apparatus such that the rear face 21 of the substrate 4 faces up. Here, the protective tape 22 prevents the laminate part 16 from coming into direct contact with the mount table, whereby each functional device 15 can be protected.

Then, lines to cut 5 are set like grids (see broken lines in FIG. 17) with respect to the object 1 so as to pass between neighboring functional devices 15, 15, and the substrate 4 is irradiated with laser light L under a condition generating multiphoton absorption, while using the rear face 21 as a laser light entrance surface, locating a light-converging point P within the substrate 4, and moving the mount table so as to scan the light-converging point P along the lines to cut 5.

The scanning of the light-converging point P along the lines to cut 5 is carried out six times per line to cut 5 while locating the light-converging point P at respective positions with different distances from the rear face 21, whereby one row of a quality modified region (first modified region) 71, three rows of segmented modified regions (second modified regions) 72, and two rows of HC (half cut) modified regions (second modified regions) 73 are formed within the substrate 4 along each line to cut 5 one by one successively from the front face 3 side. Since the substrate 4 is a semiconductor substrate made of silicon, the modified regions 71, 72, 73 are molten processed regions.

When the modified regions 71, 72, 73 are successively formed one by one from the side farther from the rear face 21 of the substrate 4, no modified region exists between the rear face 21 acting as the laser light entrance surface and the light-converging point P of laser light L at the time of forming each modified region 71, 72, 73, so that scattering, absorption, and the like of laser light L are not caused by modified regions which have already been formed. Therefore, the modified regions 71, 72, 73 can be formed with a high precision within the substrate 4 along the lines to cut 5. Also, since the rear face 21 of the substrate 4 is used as the laser light entrance surface, the modified regions 71, 72, 73 can be formed reliably within the substrate 4 along the lines to cut 5 even when a member (e.g., TEG) reflecting the laser light L exists on the lines to cut 5 of the laminate part 16.

When forming the quality modified region 71, one row of the quality modified region 71 is formed at a position where the distance between the front face 3 of the substrate 4 and the end part 71a on the front face side of the quality modified region 71 is 5 µm to 20 µm or at a position where the distance between the front face 3 of the substrate 4 and the end part 71b on the rear face side of the quality modified region 71 is [5+ (the thickness of substrate 4)×0.1] µm to [20+ (the thickness of substrate 4)×0.1] µm. When forming the segmented modified regions 72, three rows of segmented modified regions 72 are formed in series in the thickness direction of the substrate 4. Further, when forming the HC modified regions 73, two rows of HC modified regions 73 are formed as shown in FIG. 19(b), so as to generate fractures 24 extending along the lines to cut 5 from the HC modified regions 73 to the rear face 21 of the substrate 4. Depending on forming conditions, a fracture 24 may also occur between the neighboring segmented modified region 72 and HC modified region 73.

After forming the modified regions 71, 72, 73, an expandable tape 23 is bonded to the rear face 21 of the substrate 4 of the object 1 as shown in FIG. 20(a). Subsequently, the protective tape 22 is irradiated with UV rays as shown in FIG. 20(b), so as to lower its adhesive force, whereby the protective tape 22 is peeled off from the laminate part 16 of the object 1 as shown in FIG. 21(a).

Figure 21:
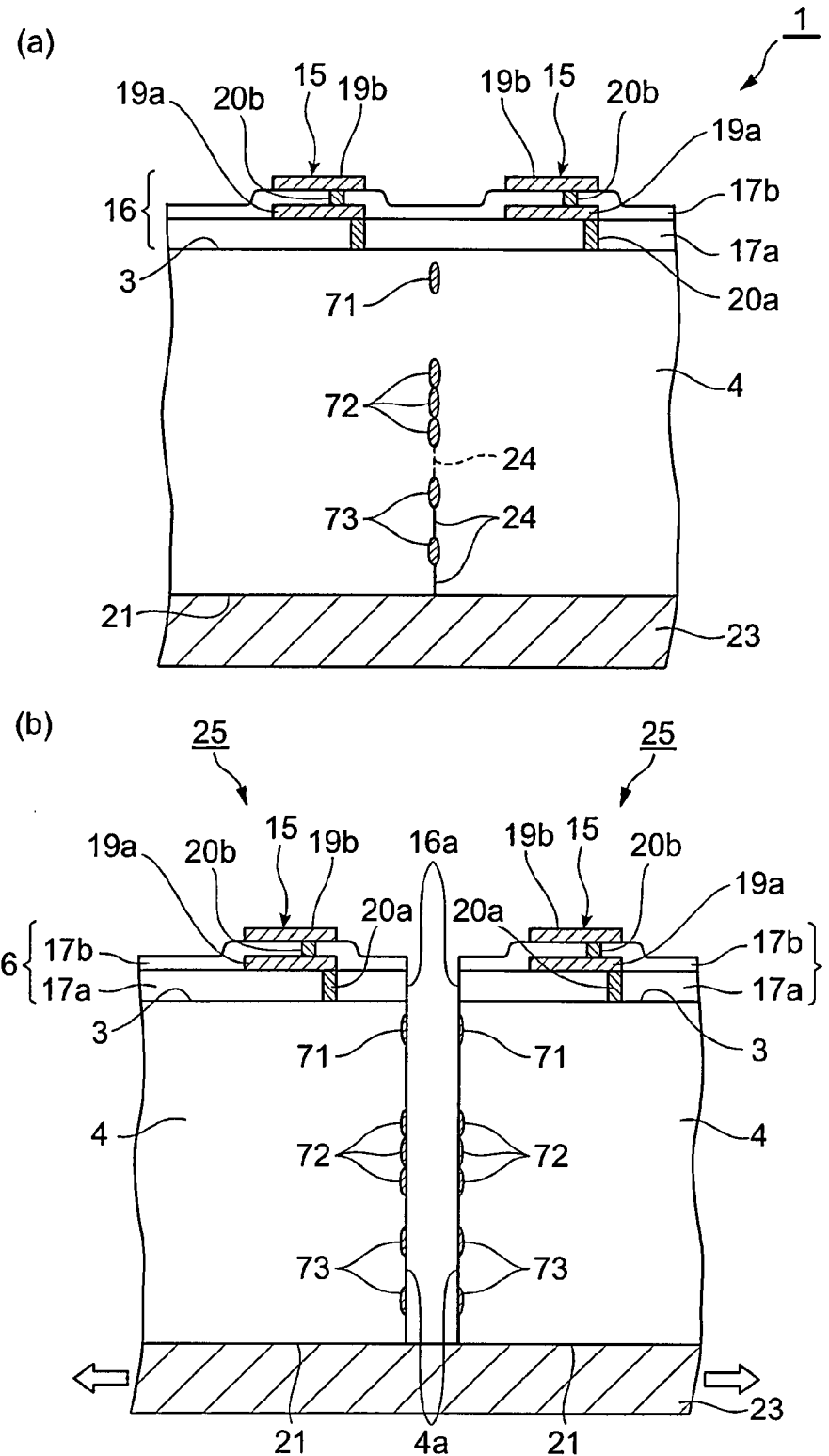
FIG. 21 is a partly sectional view of the object for explaining the laser processing method in accordance with the embodiment, in which (a) shows a state where the protective tape is peeled off from the object, and (b) shows a state where the expandable tape is expanded.
Figure 22:
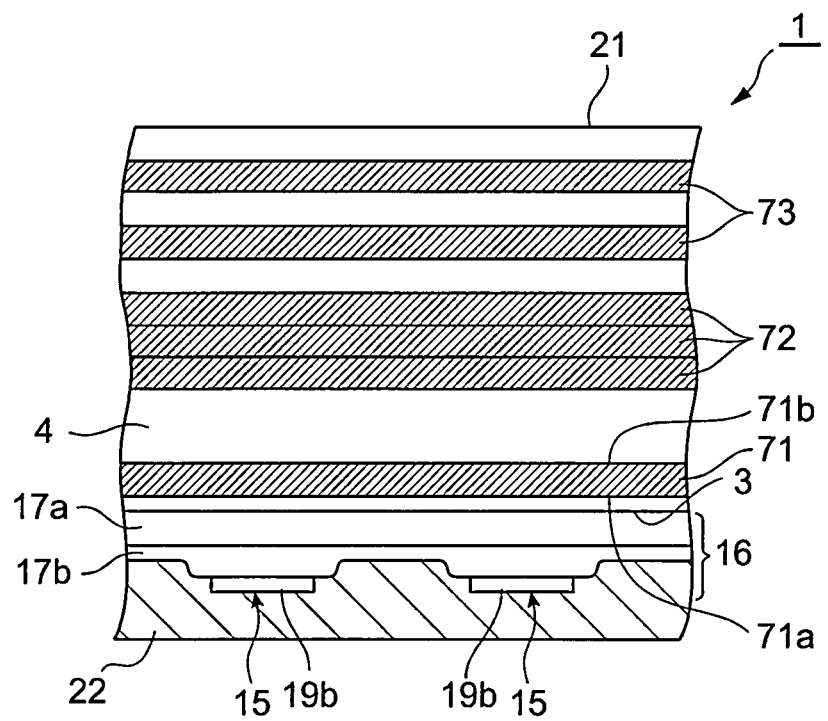
FIG. 22 is a partly sectional view of the object taken along the line XXII-XXII of FIG. 19(b)

After peeling the protective tape 22 off, the expandable tape 23 is expanded as shown in FIG. 21(b), so as to start fractures from the modified regions 71, 72, 73, thereby cutting the substrate 4 and laminate part 16 along the lines to cut 5, and separating the semiconductor chips 25 obtained by the cutting from each other.

In the above-mentioned laser processing method, as explained in the foregoing, the quality modified region 71, segmented modified regions 72, and HC modified regions 73 to become start points for cutting (fracturing) are formed within the substrate 4 along the lines to cut 5. Therefore, even when the substrate 4 formed with the laminate part 16 including a plurality of functional devices 15 is thick, e.g., with a thickness of 300 µm, the above-mentioned laser processing method can cut the substrate 4 and laminate part 16 with a high precision.

Specifically, in the above-mentioned laser processing method, two rows of HC modified regions 73 are formed at a position between the rear face 21 of the substrate 4 and the segmented modified region 72 closest to the rear face 21, whereby fractures 24 extending along the lines to cut 5 are generated from the HC modified regions 73 to the rear face 21 of the substrate 4. Therefore, when the expandable tape 23 is bonded to the rear face 21 of the substrate 4 and expanded, fractures proceed smoothly from the substrate 4 to the laminate part 16 by way of the three rows of segmented modified regions 72 formed in series in the thickness direction, whereby the substrate 4 and laminate part 16 can be cut along the lines to cut 5 with a high precision.

The segmented modified regions 72 are not limited to three rows as long as they can smoothly advance fractures from the substrate 4 to the laminate part 16. In general, the number of rows of segmented modified regions 72 is decreased/increased as the substrate 4 becomes thinner/thicker. The segmented modified regions 72 may be separated from each other as long as they can smoothly advance fractures from the substrate 4 to the laminate part 16. A single row of HC modified region 73 may be provided alone as long as it can reliably generate a fracture 24 from the HC modified region 73 to the rear face 21 of the substrate 4.

In the above-mentioned laser processing method, the quality modified region 71 is formed at a position where the distance between the front face 3 of the substrate 4 and the end part 71a of the quality modified region 71 on the front face side is 5 µm to 20 µm, or at a position where the front face 3 of the substrate 4 and the end part 71b on the rear face side of the quality modified region 71 is [5+ (the thickness of substrate 4)×0.1] µm to [20+ (the thickness of substrate 4)×0.1] µm. When the quality modified region 71 is formed at such a position, the laminate part 16 (constituted by the interlayer insulating films 17a, 17b here) formed on the front face 3 of the substrate 4 can also be cut along the lines to cut 5 with a high precision.

In each of the semiconductor chips 25 cut by using the foregoing laser processing method, the cut section (side face) 4a of the substrate 4 formed with the modified regions 71, 72, 73 and the cut section (side face) 16a of the laminate part 16 become highly accurate cut sections whose irregularities are suppressed as shown in FIG. 21(b).

Figure 23:
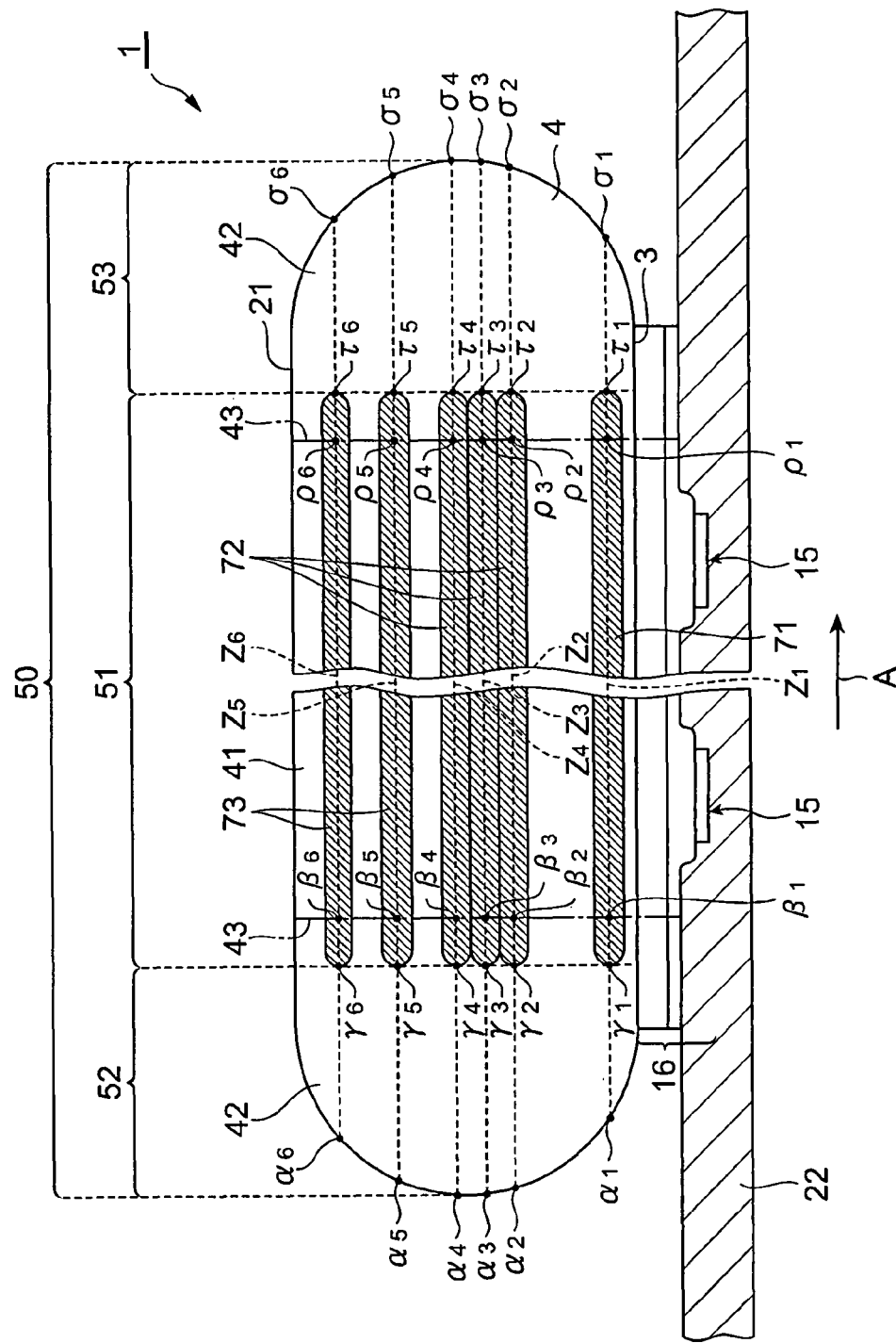
FIG. 23 is a sectional view of a part extending along a line to cut in the object shown in FIG. 17.

The above-mentioned laser processing method for forming the modified regions 71, 72, 73 will now be explained in more detail with reference to FIG. 23. FIG. 23 is a sectional view of a part extending along a line to cut in the object to be processed shown in FIG. 17. As depicted, the boundary between the effective part 41 and outer periphery 42 will be referred to as an interface 43.

First, the laser light L is continuously oscillated, and the continuously oscillated laser light L is scanned in the direction of arrow A along a line $Z_1$ to form the quality modified region 71 from the outside of the substrate 4. At point $\gamma_1$ positioned between point $\alpha_1$ (an intersection between the line $Z_1$ and the outer face of the substrate 4) and point $\beta_1$ (an intersection between the line $Z_1$ and the interface 43), the laser light L is switched from continuous oscillation to pulse oscillation, and the pulse-oscillated laser light L is scanned in the direction of arrow A along the line $Z_1$ from the point $\gamma_1$. At point $\tau_1$ positioned between point $\rho_1$ (an intersection between the line $Z_1$ and the interface 43) and point $\sigma_1$ (an intersection between the line $Z_1$ and the outer face of the substrate 4), the laser light L is switched from pulse oscillation to continuous oscillation, and the continuously oscillated laser light L is scanned in the direction of arrow A along the line $Z_1$ from the point $\tau_1$ to the outside of the substrate 4. The switching between continuous oscillation and pulse oscillation of the laser light L can be performed easily in a simple fashion by a power controller which regulates the laser light L, for example.

Also, the laser light L is continuously oscillated, and the continuously oscillated laser light L is scanned in the direction of arrow A along a line $Z_2$ to form the segmented modified region 72 on the front face 3 side from the outside of the substrate 4. At point $\gamma_2$ positioned between points $\alpha_2$ and $\beta_2$, the laser light L is switched from continuous oscillation to pulse oscillation, and the pulse-oscillated laser light L is scanned in the direction of arrow A along the line $Z_2$ from the point $\gamma_2$. At point $\tau_2$ positioned between points $\rho_2$ and $\sigma_2$, the laser light L is switched from pulse oscillation to continuous oscillation, and the continuously oscillated laser light L is scanned in the direction of arrow A along the line $Z_2$ from the point $\tau_2$ to the outside of the substrate 4. Similarly, a line $Z_3$ to form the center segmented modified region 72 and a line $Z_4$ to form the segmented modified region 72 on the rear face 21 side are scanned with the laser light L.

Further, the laser light L is continuously oscillated, and the continuously oscillated laser light L is scanned in the direction of arrow A along a line $Z_5$ to form the HC modified region 73 on the front face 3 side from the outside of the substrate 4. At point $\gamma_5$ positioned between points $\alpha_5$ and $\gamma_5$, the laser light L is switched from continuous oscillation to pulse oscillation, and the pulse-oscillated laser light L is scanned in the direction of arrow A along the line $Z_5$ from the point $\gamma_5$. At point $\tau_5$ positioned between points $\rho_5$ and $\sigma_5$, the laser light L is switched from pulse oscillation to continuous oscillation, and the continuously oscillated laser light L is scanned in the direction of arrow A along the line $Z_5$ from the point $\tau_5$ to the outside of the substrate 4. Similarly, a line $Z_6$ to form the HC modified region 73 on the rear face 21 side is scanned with the laser light L.

As explained in the foregoing, the laser processing method for forming the modified regions 71, 72, 73 oscillates the laser light L in a pulsing fashion in an intermediate portion 51 including the effective part 41 in a part 50 extending along the lines to cut 5 in the object to be processed 1, and continuously oscillates the laser light L in one end portion 52 and the other end portion 53 on both sides of the intermediate portion 51. The intensity of laser light L becomes lower in continuous oscillation than in pulse oscillation, whereby the modified regions 71, 72, 73 can be formed in the intermediate portion 51 but not in one end portion 52 and the other end portion 53. This keeps the modified regions 71, 72, 73 from reaching the outer face of the substrate 4, so that the substrate 4 is not turned into small pieces in steps other than its dividing step, which makes it possible to restrain chipping from being caused by cut sections of small pieces rubbing against each other. On the other hand, the modified regions 71, 72, 73 are reliably formed in the effective part 41 surrounded by the outer peripheral part 42, whereby the effective part 41 can be cut with a high precision along the lines to cut 5 while using the modified regions 71, 72, 73 as a starting point for cutting.

Figure 24:
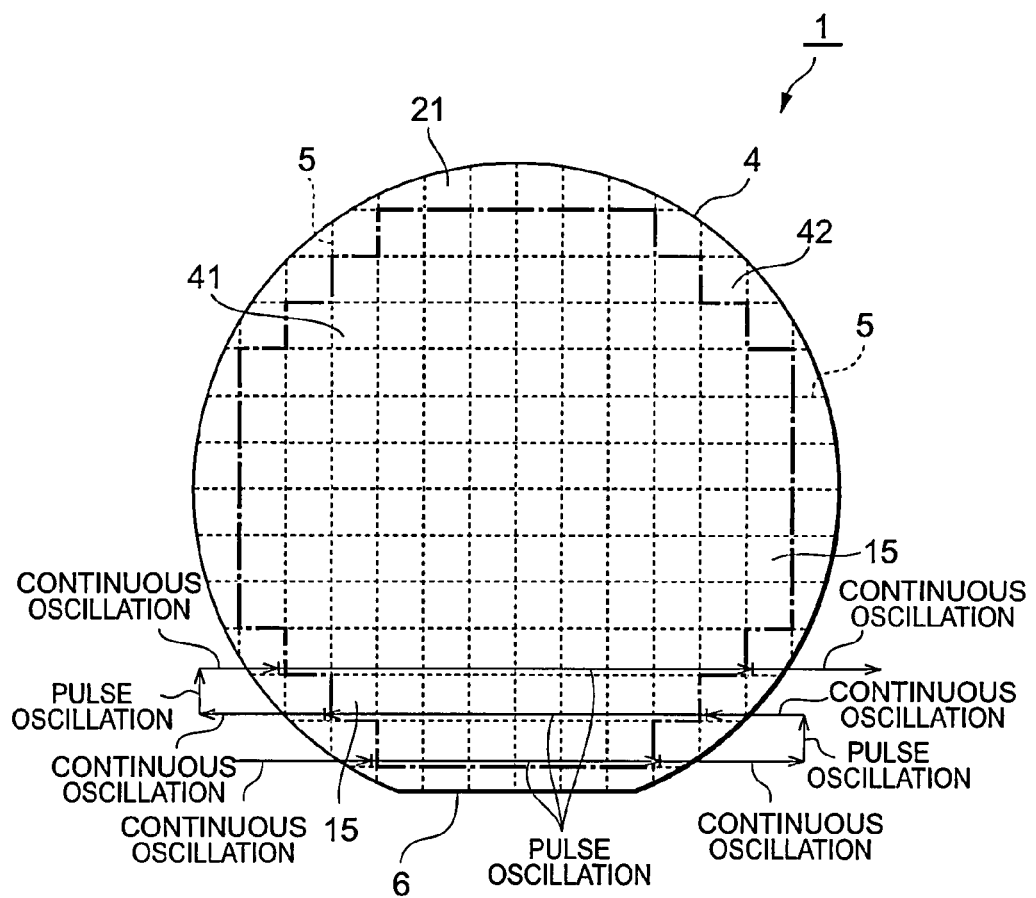
FIG. 24 is a bottom view of the object shown in FIG. 17.

When shifting the laser light L from scanning along a predetermined line to cut 5 to scanning along a line to cut 5 adjacent to the former line to cut 5, it will be preferred if the laser light L is once switched from continuous oscillation to pulse oscillation and then from pulse oscillation to continuous oscillation as shown in FIG. 24. This can shorten the time during which the laser light L is continuously oscillated in the shift. Therefore, when switching the laser light from continuous oscillation to pulse oscillation, a stable intensity of laser light L can be obtained in the scanning of laser light L along the line to cut 5 adjacent to the predetermined line to cut 5.

By processing the boundary part between an organic film such as the protective tape 22 or expandable tape 23 attached to the substrate 4 and its surroundings (i.e., the upper face of the film not bonded to the substrate 4, the boundary part between the film and substrate 4, and the area extending to the outer periphery of the effective part 41 of the substrate 4) in the continuous oscillation mode so as not to form modified regions, and the effective part 41 of the substrate 4 in the pulse oscillation mode so as to form modified regions, the present invention can further effectively prevent dust from being generated by the processing of areas other than the desirable areas caused by changes in behaviors of laser light owing to differences in levels of the substrate 4 and the film, mainly resulting from the followability in positional control of a laser light focal point control (autofocus) apparatus.

The present invention is not limited to the above-mentioned embodiment.

Figure 25:
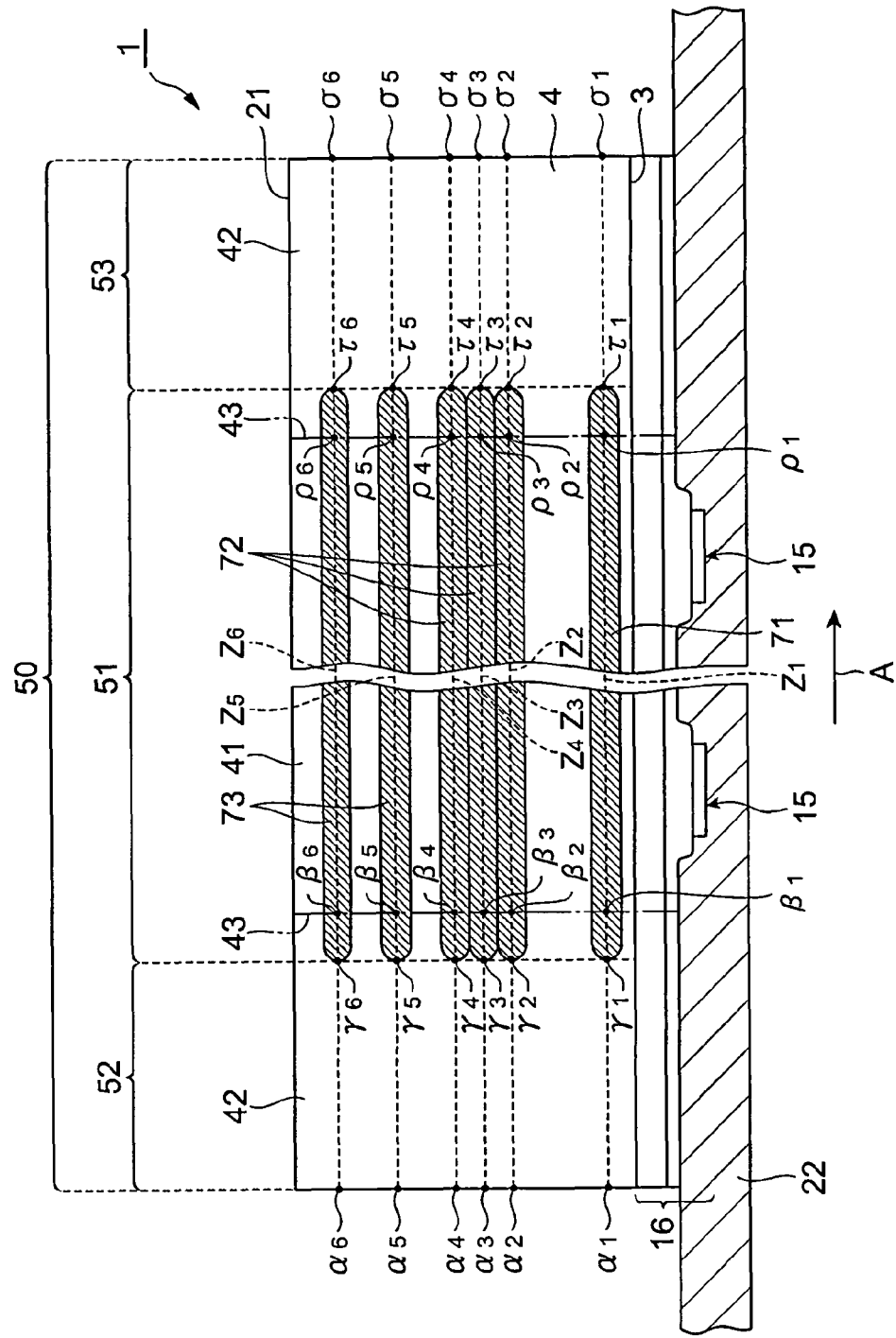
FIG. 25 is a sectional view of a part extending along the line to cut in another object to be processed.
Figure 26:
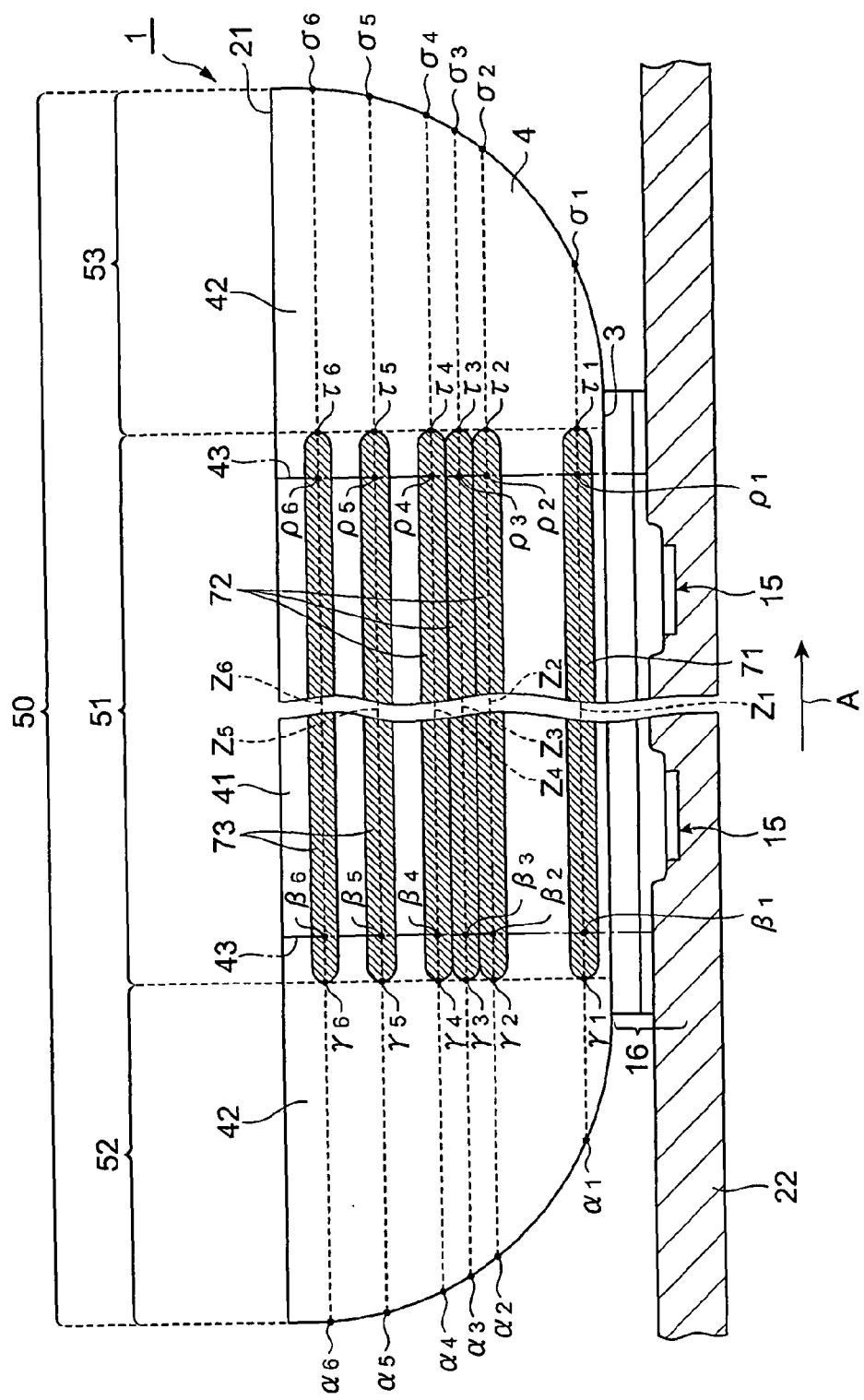
FIG. 26 is a sectional view of a part extending along the line to cut in still another object to be processed.
Figure 27:
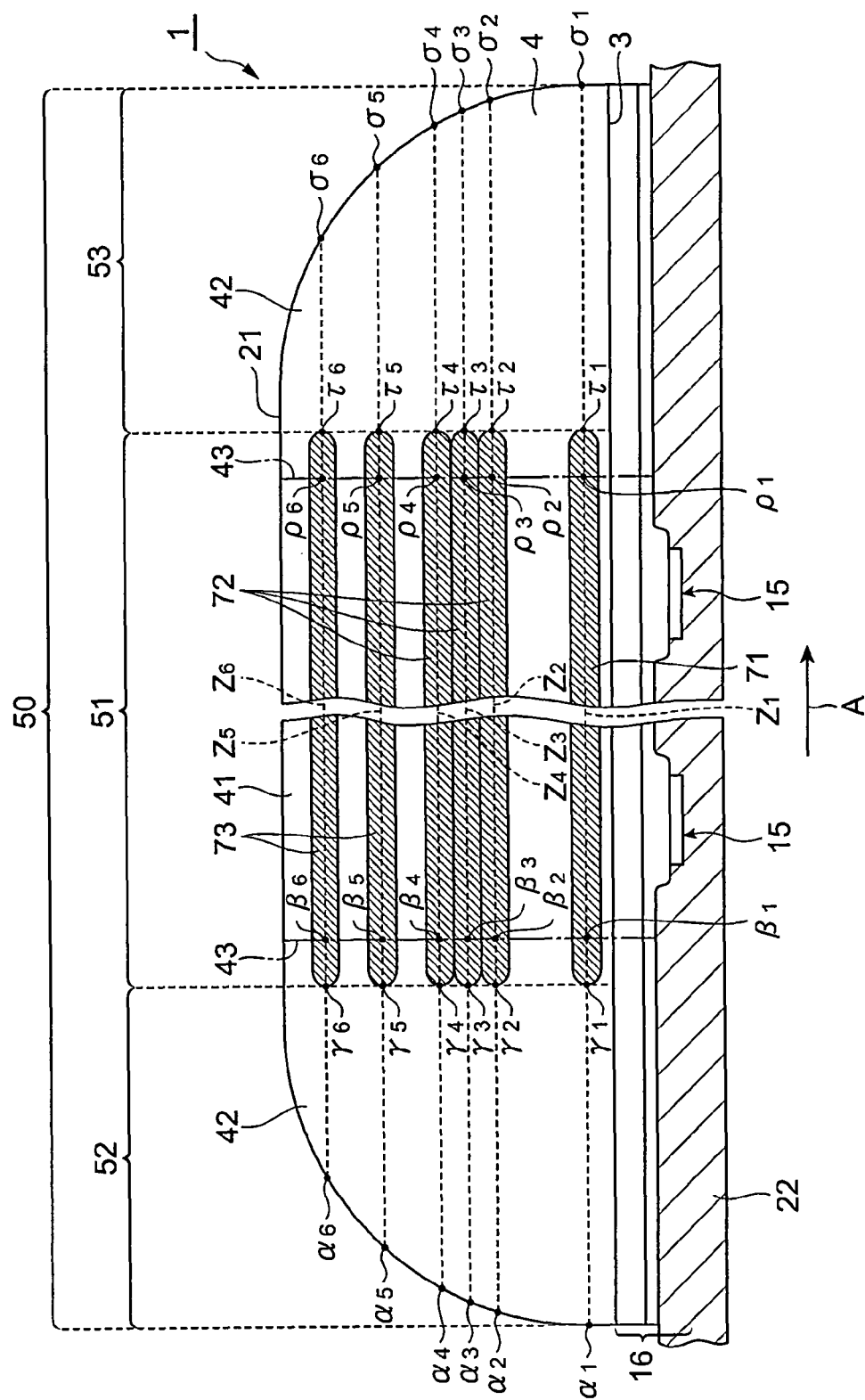
FIG. 27 is a sectional view of a part extending along the line to cut in still another object to be processed.

For example, though the corners on both the front face 3 side and rear face 21 side are rounded in the outer peripheral part 42 of the substrate 4 in the object 1 in accordance with the above-mentioned embodiment, the corners of the outer peripheral part 42 on both the front face 3 side and rear face 21 side may be kept from being rounded as shown in FIG. 25. Alternatively, only the corners of the outer peripheral part 42 on the front face 3 side may be rounded as shown in FIG. 26, or only the corners of the outer peripheral part 42 on the rear face 21 side may be rounded as shown in FIG. 27.

Though the points $\gamma_1$ to $\gamma_6$ where the laser light L is switched from continuous oscillation to pulse oscillation are located at the same position in the thickness direction of the substrate 4 in the above-mentioned embodiment, they may differ from each other in the thickness direction as long as they are located within the outer peripheral part 42. The same holds in the points $\tau_1$ to $\tau_6$ where the laser light L is switched from pulse oscillation to continuous oscillation.

Industrial Applicability

In the present invention, a plate-like object to be processed formed with a modified region is harder to become small pieces in steps other than its dividing step, whereby chipping can be restrained from being caused by cut sections of small pieces rubbing against each other.

The invention claimed is:

1. A laser processing method for forming a modified region inside a plate-like object along a cutting line, the modified region serving as a mechanically weakened area inside the plate-like object for cutting, the plate-like object including an effective part that is to be cut, and an outer peripheral part surrounding the effective part, the cutting line having a first end portion, an intermediate portion, and a second end portion, the intermediate portion covering the effective part, the method comprising:
   (i) continuously oscillating the laser light while moving a light-converging point of a laser light along the first end portion, thereby avoiding formation of the modified region at the first end portion of the cutting line;
   (ii) pulse oscillating the laser light while moving the light-converging point of the laser light along the intermediate portion so that the intensity of the light-converging point of the laser light is such that the modified region is formed continuously at the intermediate portion of the cutting line; and
   (iii) continuously oscillating the laser light while moving the light-converging point of the laser light along the second end portion, thereby avoiding formation of the modified region at the second end portion of the cutting line;
   wherein steps (i), (ii), and (iii) are performed such that while the light-converging point is moved along the first end portion, the intermediate portion, and the second end portion of the cutting line, the laser light is switched from continuous oscillation to pulse oscillation at a transition from the first end portion to the intermediate portion, and is switched from pulse oscillation to continuous oscillation at a transition from the intermediate portion to the second end portion.

2. The laser processing method according to claim 1, wherein a plurality of functional devices are formed into a matrix on a surface, of the effective part of the plate-like object.

3. The laser processing method according to claim 2, wherein the cutting line to cut is set as a lattice with respect to the plate-like object so as to pass between adjacent functional devices.

4. The laser processing method according to claim 1, wherein
   the effective part and outer peripheral part are formed integrally by semiconductor material, and the modified region includes a molten processed region.

5. The laser processing method according to claim 1, further comprising the step of:
   cutting the plate-like object along the cutting line after said step of (ii) pulse oscillating the laser light.

6. The laser processing method according to claim 1, wherein the modified region inside the plate-like object is formed in a horizontal direction with respect to the lateral expansion of the plate-like object at a predetermined depth inside the plate-like object.

7. A laser processing method for forming a modified region inside a wafer along a predefined cutting line, the modified region being a mechanically weakened area inside the wafer, the wafer including an effective part that is to be cut and an outer area part, the cutting line having a cutting portion and an end portion, the cutting portion covering the effective part of the wafer and covering a part of the outer area part of the wafer, the method comprising:
   (i) continuously oscillating the laser light while moving a light-converging, point of a laser light along the end portion inside the wafer, the laser light being configured such that formation of the modified region is avoided at the end portion; and
   (ii) pulse oscillating the laser light while moving the light-converging, point of the laser light along the cutting portion inside the wafer so that the intensity of the light-converging point of the laser light is such that the modified region is formed continuously at the cutting portion;
   wherein the (i) continuously oscillating step and the (ii) pulse oscillating step are performed such that while the light-converging point is moved along the end portion and the cutting portion of the cutting line, the laser light is switched from continuous oscillation to pulse oscillation at a transition from the end portion to the cutting portion.

* * * * *

UNITED STATES PATENT AND TRADEMARK OFFICE
CERTIFICATE OF CORRECTION

PATENT NO.         : 8,735,771 B2
APPLICATION NO.    : 11/886655
DATED              : May 27, 2014
INVENTOR(S)        : Kuno et al.

Page 1 of 1

It is certified that error appears in the above-identified patent and that said Letters Patent is hereby corrected as shown below:

On the title page of the Patent

Item [73]: Delete "Hamamatsu Photonicks K.K.," and insert --"Hamamatsu Photonics K.K.,"--

Signed and Sealed this
Twenty-sixth Day of August, 2014

Michelle K. Lee
*Deputy Director of the United States Patent and Trademark Office*